United States Patent
Horng et al.

(10) Patent No.: US 7,018,175 B2
(45) Date of Patent: *Mar. 28, 2006

(54) AIRFLOW GUIDING STRUCTURE FOR A HEAT DISSIPATION FAN

(75) Inventors: Alex Horng, Kaohsiung (TW); Yin-Rong Hong, Kaohsiung (TW); Ching-Sheng Hong, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 66 days.

This patent is subject to a terminal disclaimer.

(21) Appl. No.: 10/699,642

(22) Filed: Nov. 4, 2003

(65) Prior Publication Data

US 2005/0063822 A1   Mar. 24, 2005

(51) Int. Cl.
*F04D 19/00* (2006.01)

(52) U.S. Cl. .................................................. 415/211.2
(58) Field of Classification Search ............ 415/182.1, 415/207, 208.1, 208.2, 211.2, 220
See application file for complete search history.

(56) References Cited

U.S. PATENT DOCUMENTS

| 1,811,828 | A | * | 6/1931 | Ackerman ................ 415/211.2 |
| 2,144,035 | A | * | 1/1939 | Smith, Jr. ................ 415/211.2 |
| 2,146,339 | A | * | 2/1939 | Jackson .................... 415/211.2 |
| 2,636,668 | A | * | 4/1953 | Meyer et al. ............ 415/211.2 |
| 2,936,109 | A | | 5/1960 | Copeland |
| 4,120,615 | A | | 10/1978 | Keem et al. |
| 5,096,373 | A | | 3/1992 | Struve et al. |
| 6,328,529 | B1 | * | 12/2001 | Yamaguchi et al. ...... 415/211.2 |
| 2005/0025621 | A1 | * | 2/2005 | Horng et al. ............ 514/211.2 |

* cited by examiner

*Primary Examiner*—Edward K. Look
*Assistant Examiner*—Richard A. Edgar
(74) *Attorney, Agent, or Firm*—Bacon & Thomas, PLLC (57) ABSTRACT

An airflow guiding structure for the heat dissipation fan includes a housing, a base and a plurality of guiding members. The housing is formed with an air outlet at which the base and the guiding members are provided. The base is used to support a fan wheel and supported by the guiding members. The guiding members are arranged in at least two guiding directions at the air outlet and at least one of the guiding members is inclined to an axis of the housing. When the fan wheel rotates, the guiding members guide airflow to the two guiding directions.

11 Claims, 13 Drawing Sheets

AIRFLOW GUIDING STRUCTURE FOR A HEAT DISSIPATION FAN

BACKGROUND OF THE INVENTION

1. Field of the Invention

The present invention is related to an airflow guiding structure for a heat dissipation fan. More particularly, the present invention is related to the airflow guiding structure having a plurality of guiding members for guiding airflow at an auxiliary air outlet.

2. Description of the Related Art

Figure 1:
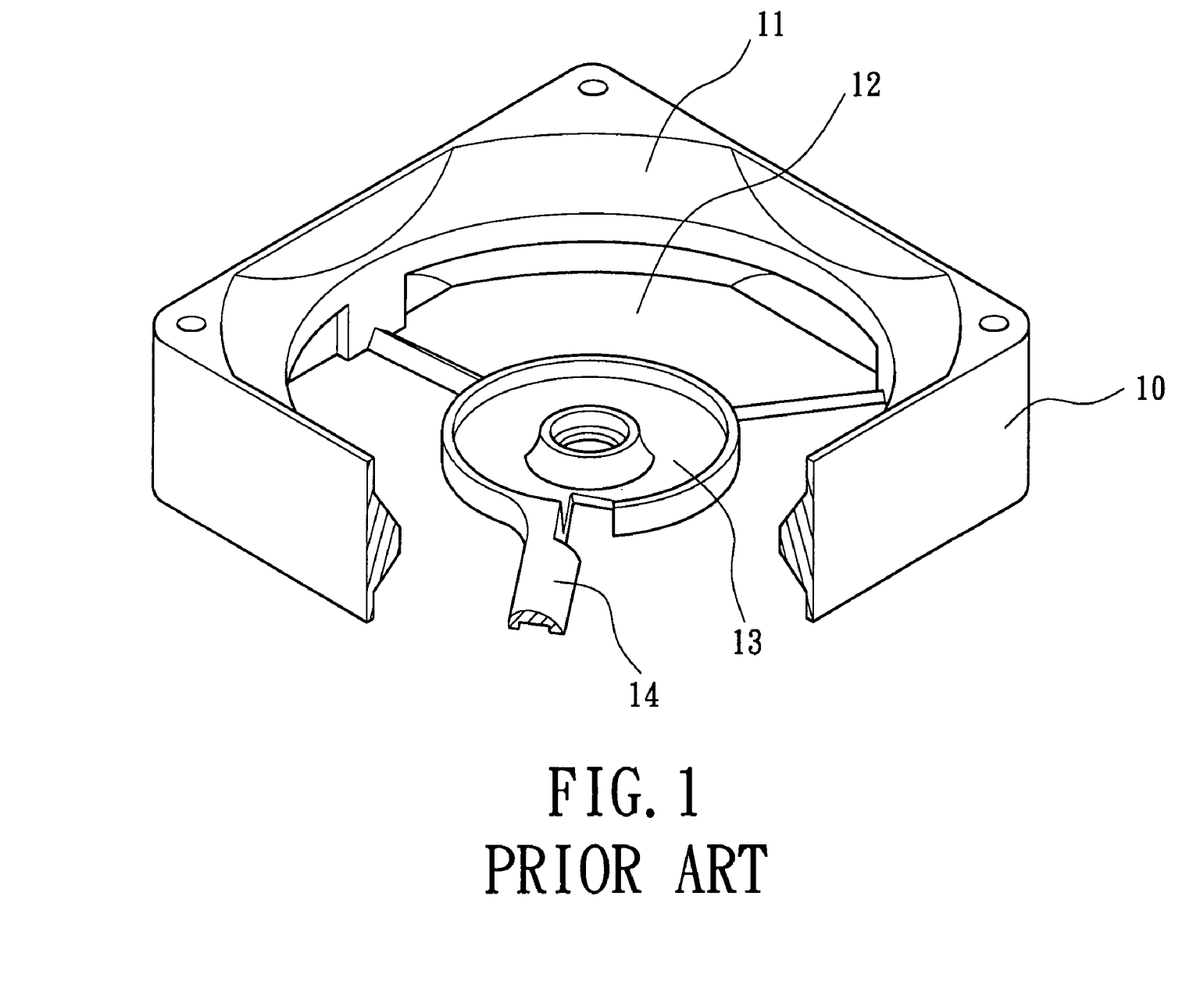
FIG. 1 is a partially cutaway perspective view of a housing structure in accordance with the prior art.

Referring initially to FIG. 1, a conventional housing structure for a heat dissipation fan includes a housing 10, an air inlet 11, an air outlet 12, a base 13 and a plurality of supporting ribs 14. The housing 10 has a first side provided with the air inlet 11 and a second side with the air outlet 12. The supporting ribs 14 support the base 13 to locate in the air outlet 12. The base 13 is used to mount a stator (not shown), a rotor (not shown) and a fan wheel (not shown). When the fan wheel is rotated, cooling air can enter the air inlet 11 and be exhausted from the air outlet 12 to cool a heat source, such as a fin assembly or a Central Processing Unit (not shown).

Although the heat dissipation fan can perform heat-dissipating function indeed, cooling air is generally exhausted from the air outlet 12 only in an axial direction of the housing 10 to cool a heat generating component located under the housing 10. However, an inner assembling space of a casing (such as an interior of a notebook) for the heat generating component is limited and thus the location of the heat generating component cannot be combined with the base 13 in a right vertical direction or around the air outlet 12. Furthermore, when the heat generating component may be dimensioned in a large scale greater than a periphery of the air outlet 12 and thus cannot be encompassed by the air outlet 12, the cooling airflow cannot cover the entire heat generating component. Accordingly, it results in an irregular heat-dissipation that affects the heat-dissipation efficiency. Meanwhile, the supporting ribs 14 may also cause air turbulence and air noise while cooling air passing through them. Hence, there is a need for an airflow guiding structure with an enlarged cooling area that enhances heat-dissipation efficiency.

U.S. Pat. No. 5,096,373, issued to Struve et al. on Mar. 17, 1992, entitled "UNITARY HEAT SINK FOR INTEGRATED CIRCUITS," discloses a fan housing having a plurality of spaced apart bars. Each of the bars has a teardrop shape which creates minimal drag on an airflow exhausting from air passages. However, the bars guide airflow only in a single direction with respect to the air passages.

U.S. Pat. No. 4,120,615, issued to Keem et al. on Oct. 17, 1978, "BOX FANS," discloses a box structure which bears a plurality of vanes on a grille to deflect airflow. The vanes are variously aligned vanes to produce a gyratory airflow pattern. However, the vanes cannot provide with an enlarged cooling area at an air outlet.

U.S. Pat. No. 2,936,109, issued to COPELAND on May 10, 1960, entitled "DEFLECTOR FOR FANS AND THE LIKES," discloses a modified deflector consisted of horizontal louvers and vertical louvers. In order to achieve a desirable air dispersion pattern for a fan, the deflector must be used with a fan blade. However, the deflector cannot provide with an enlarged cooling area at an air outlet.

Still, there is a need for an airflow guiding structure for enhancing heat-dissipation efficiency.

The present invention intends to provide an airflow guiding structure for a heat dissipation fan, which consists of at least one guiding member and at least one auxiliary air outlet in such a way to mitigate and overcome the above problem.

SUMMARY OF THE INVENTION

The primary objective of this invention is to provide an airflow guiding structure for a heat dissipation fan, which includes a plurality of guiding members at an air outlet. The guiding members are inclined to constitute at least two guiding directions, thereby guiding airflow and increasing the heat-dissipation efficiency.

The secondary objective of this invention is to provide the airflow guiding structure for the heat dissipation fan, which includes a plurality of guiding members being arranged to constitute at least two guiding directions. The guiding members are aimed at two heat generating components for synchronous heat dissipation, thereby increasing the entire heat-dissipation efficiency and assembling design choice.

Another objective of this invention is to provide the airflow guiding structure for the heat dissipation fan, which includes a plurality of guiding members formed with triangular cross-sections to thereby increase air pressure and the entire heat-dissipation efficiency.

Another objective of this invention is to provide the airflow guiding structure for the heat dissipation fan, which includes a plurality of guiding members. Each of the guiding members has a first camber edge proximate an air inlet, and a second camber edge proximate an air outlet, thereby decreasing air noise and increasing the entire heat-dissipation efficiency.

Another objective of this invention is to provide the airflow guiding structure for the heat dissipation fan, which includes a plurality of guiding members. Each of the guiding members has a transverse extension selected from a group consisted of a straight line, a V-shaped line, and a curved line, thereby enhancing product appearance and increasing additional value.

The airflow guiding structure for the heat dissipation fan in accordance with the present invention includes a housing, a base and a plurality of guiding members. The housing is formed with an air outlet at which the base and the guiding members are provided. The base is used to support a fan wheel and supported by the guiding members. The guiding members are arranged in at least two guiding directions at the air outlet and at least one of the guiding members is inclined to an axis of the housing. When the fan wheel rotates, the guiding members guide airflow to the two guiding directions.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

Figure 2:
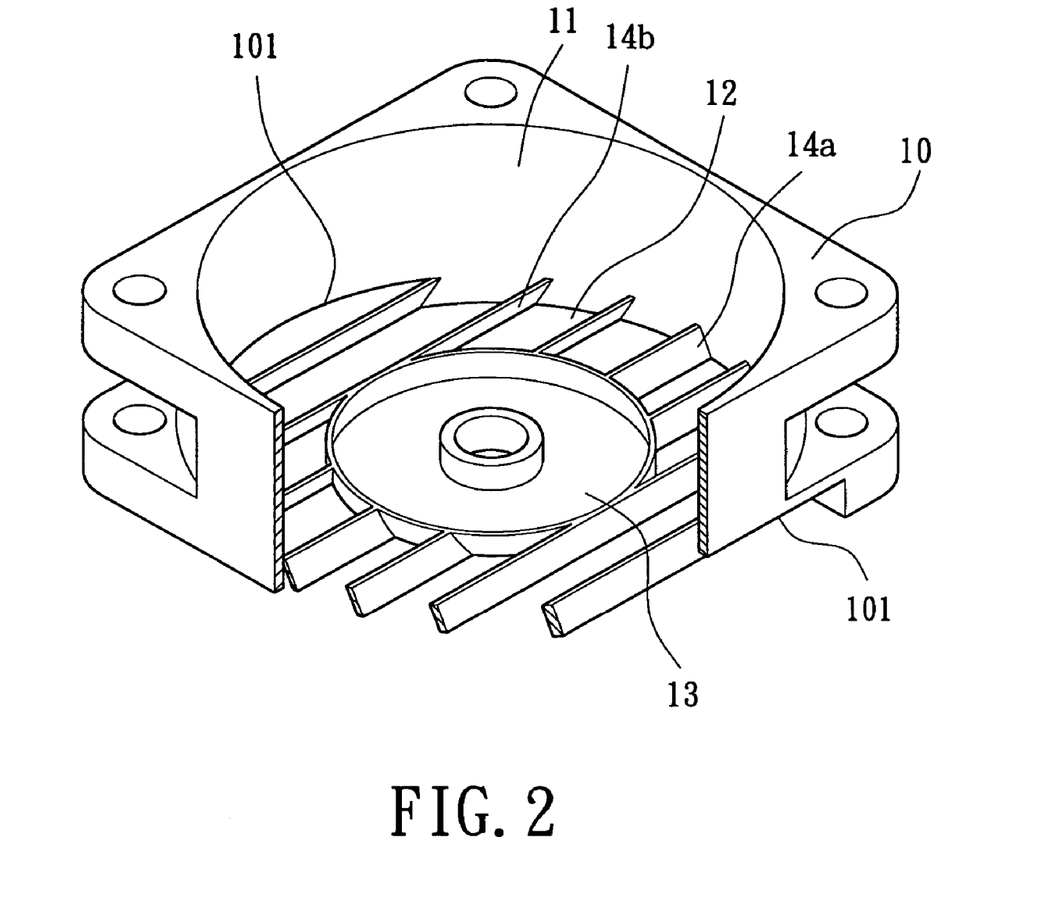
FIG. 2 is a partially cutaway perspective view of an airflow guiding structure for a heat dissipation fan in accordance with the first embodiment of the present invention.
Figure 3:
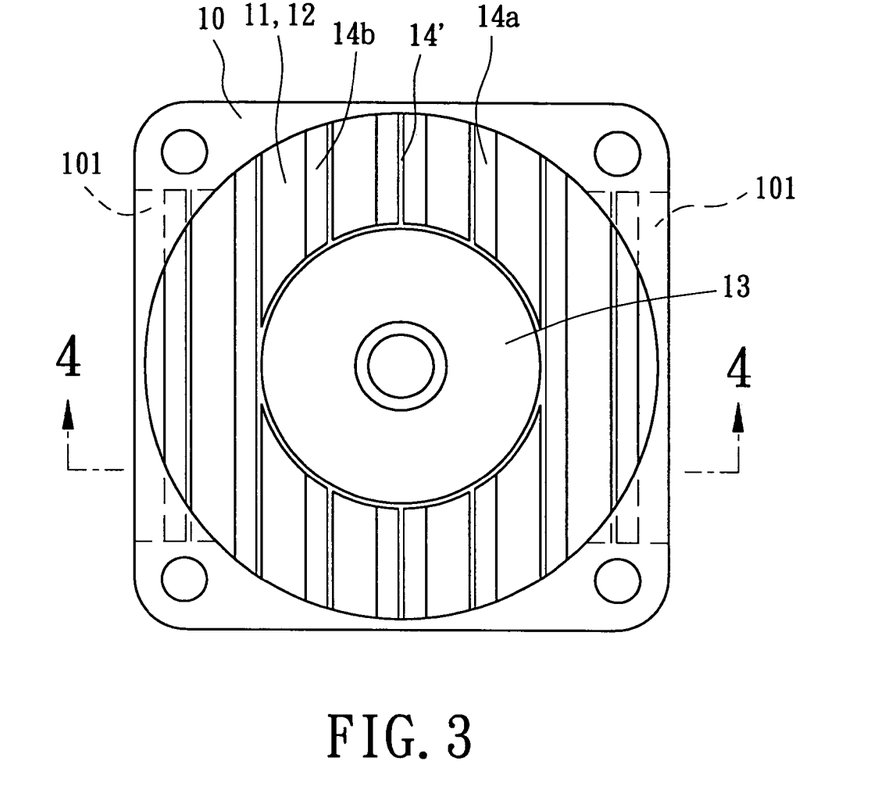
FIG. 3 is a top view of the airflow guiding structure for the heat dissipation fan in accordance with the first embodiment of the present invention.
Figure 4:
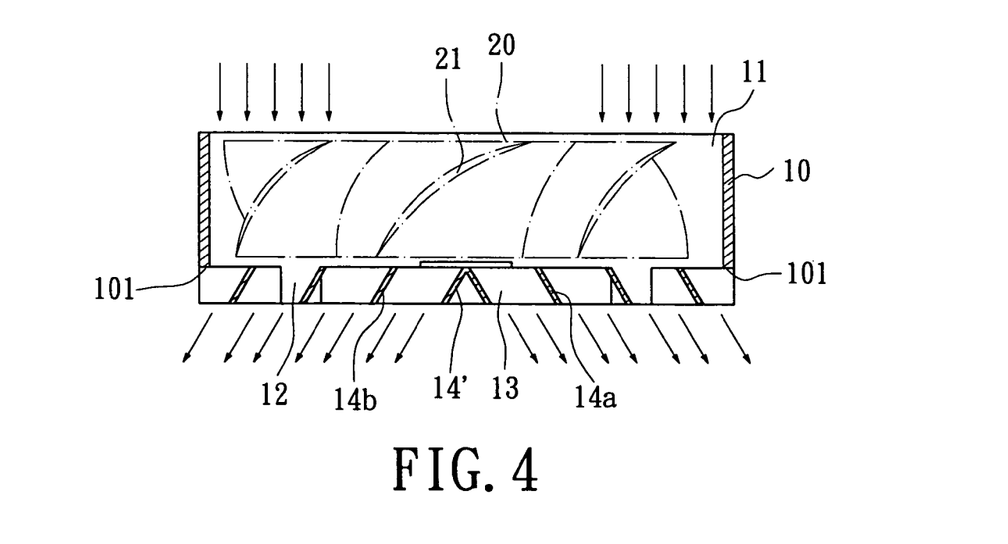
FIG. 4 is a cross-sectional view, taken along line 4—4 in FIG. 3, of the airflow guiding structure for the heat dissipation fan in accordance with the first embodiment of the present invention.

Referring to FIGS. 2 through 4, reference numerals of the first embodiment of the present invention has applied the identical numerals of the prior art, as shown in FIG. 1. The housing structure in accordance with the first embodiment of the present invention has similar configuration and same function as that of the prior art and the detailed descriptions may be omitted.

Referring again to FIGS. 2 through 4, an airflow guiding structure in accordance with a first embodiment of the present invention includes a housing 10, an air inlet 11, an air outlet 12, a base 13, a set of first guiding members 14a, a set of second guiding members 14b and a pair of auxiliary air outlets 101. Preferably, the housing 10 is one-piece member made of plastic or metal. The air inlet 11 and the air outlet 12 are located at the two opposite sides of the housing 10. The air outlet 12 of the housing 10 provides with the base 13 with which to rotatably connect a fan wheel 20, as shown in FIG. 4. The first guiding members 14a are arranged in a predetermined inclination and disposed in one half of the air outlet 12. Alternatively, the second guiding members 14b are arranged in an opposite inclination and disposed in the other one half of the air outlet 12. Some of the first guiding members 14a and the second guiding members 14b connect the base 13 with the housing 10 so that they mount the base 13 in the air outlet 12. Preferably, the first guiding members 14a and the second guiding members 14b are in the form of grille. Moreover, each of the first guiding members 14a and the second guiding members 14b has an extension in a straight line running within the air outlet 12. The first guiding members 14a and the second guiding members 14b are substantially inclined to an outer periphery of the housing 10. An inclined angle of the first guiding member 14a can be designed identical with or different from that of the second guiding member 14b. Either set of the first guiding members 14a and the second guiding members 14b has a regular or irregular inclination with respect to an axis of the housing 10. Preferably, the auxiliary air outlets 101 are disposed on an annular wall of the housing 10 proximate the air outlet 12, and connected thereto. Each of the auxiliary air outlets 101 is adjacent to the corresponding set of the guiding members 14a and 14b to allow passage of airflow deflected by the guiding members 14a and 14b. One of the first guiding members 14a is adjacent to one of the second guiding members 14b, and connected thereto to constitute an inverted V section of a guiding member 14'.

Referring again to FIG. 4, it illustrates a schematic view of airflow deflected by the first guiding members 14a and the second guiding members 14b in accordance with the first embodiment of the present invention. When the fan wheel 20 rotates, a series of blades 21 drive an airflow sucked into the air inlet 11 and then exhausted from the air outlet 12, thereby heat-dissipating a heat generating component (such as a fin assembly or a Central Processing Unit). In consequence, airflow must pass through the first guiding members 14a, the second guiding members 14b and the auxiliary air outlets 101. Due to inclinations of the first guiding members 14a and the second guiding members 14b to the outer periphery of the housing 10, the airflow is guided to two predetermined directions located at the two auxiliary air outlets 101. Thereby, the first guiding members 14a and the second guiding members 14b are able to increase heat-dissipation efficiency of the heat generating components. In use, the first guiding members 14a and the second guiding members 14b deflect airflow on a small, inner space of a casing (such as an interior of a notebook) and a large scale of the heat generating component which is mis-aligned with the air outlet 12 in vertical direction.

Referring again to FIG. 4, deflecting from the axis of the housing, the airflow passes through the two auxiliary air outlets 101 without obstruction of the housing 10 in addition to the air outlet 12. Thereby, the present invention carries out reduction of air turbulence and air noise.

Figure 5:
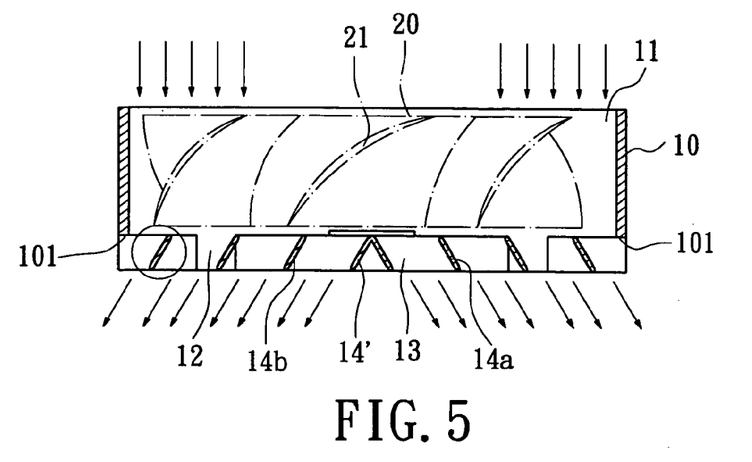
FIG. 5 is a cross-sectional view of the airflow guiding structure for the heat dissipation fan in accordance with the second embodiment of the present invention.
Figure 5A:
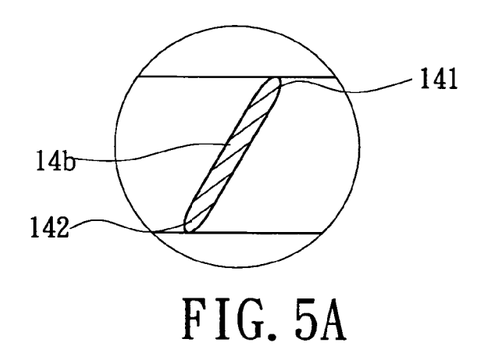
FIG. 5A is an enlarged view, in FIG. 5, of the airflow guiding structure for the heat dissipation fan in accordance with the second embodiment of the present invention.

Turning now to FIGS. 5 and 5A, they illustrate cross-sectional views of the airflow guiding structure for the heat dissipation fan in accordance with the second embodiment of the present invention. In comparison with the first embodiment, each of the first guiding members 14a and the second guiding members 14b of the second embodiment has a first camber edge 141 proximate an air inlet 11, and a second camber edge 142 proximate an air outlet 12. When the airflow passes through either of the first camber edges 141 or the second camber edges 142, it decreases air noise and increases the entire heat-dissipation efficiency.

Figure 6:
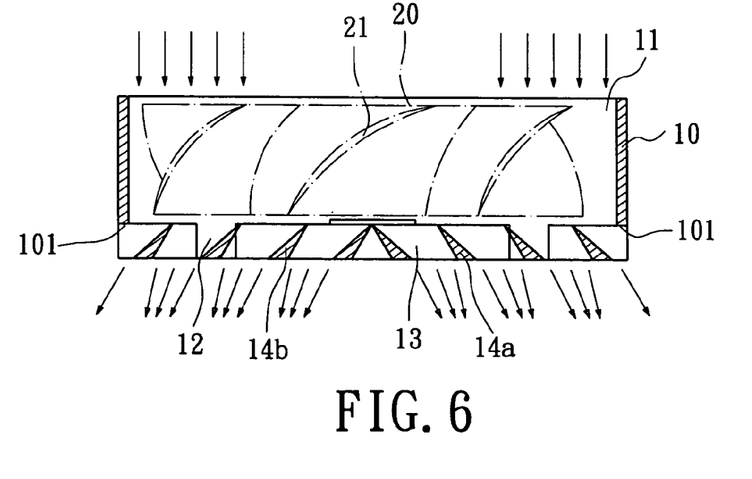
FIG. 6 is a cross-sectional view of the airflow guiding structure for the heat dissipation fan in accordance with the third embodiment of the present invention.

Turning now to FIG. 6, it illustrates a cross-sectional view of the airflow guiding structure for the heat dissipation fan in accordance with the third embodiment of the present invention. In comparison with the first and second embodiments, each of the first guiding members 14a and the second guiding members 14b of the third embodiment has a triangular section so that an air passage between any two adjacent guiding members is tapered. When the airflow passes through the air passage, the guiding members 14a and 14b carries out an increase of air pressure for enhancing the entire heat-dissipation efficiency in addition to deflecting airflow to predetermined directions.

Figure 7:
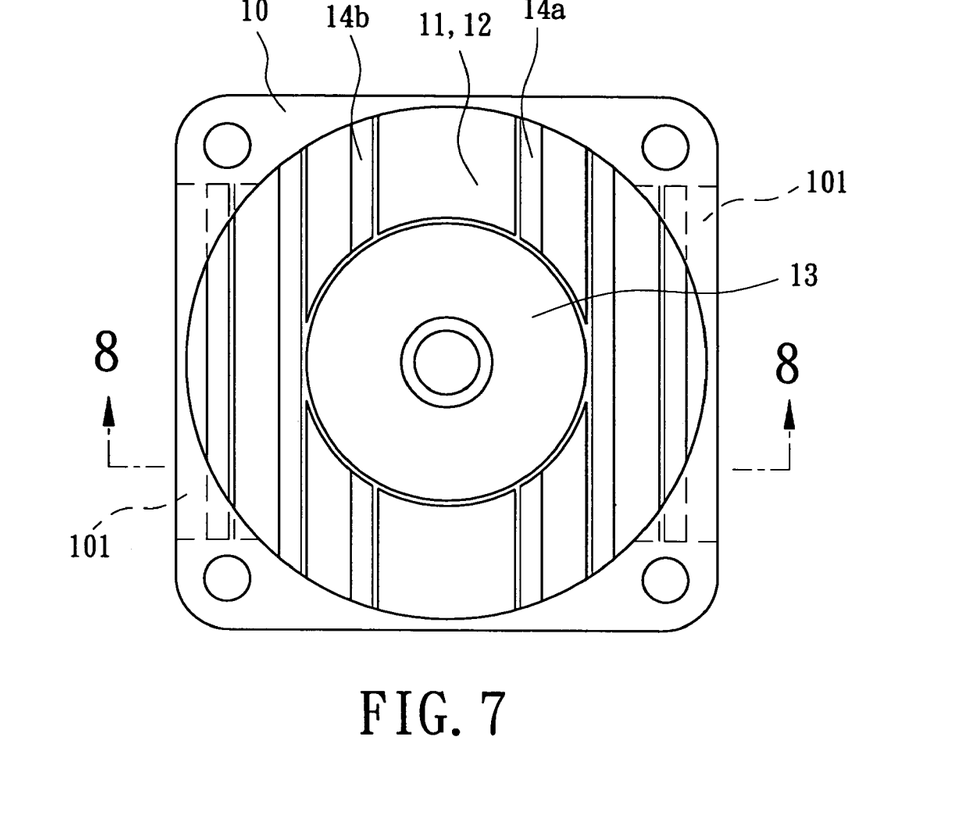
FIG. 7 is a top view of the airflow guiding structure for the heat dissipation fan in accordance with the fourth embodiment of the present invention.
Figure 8:
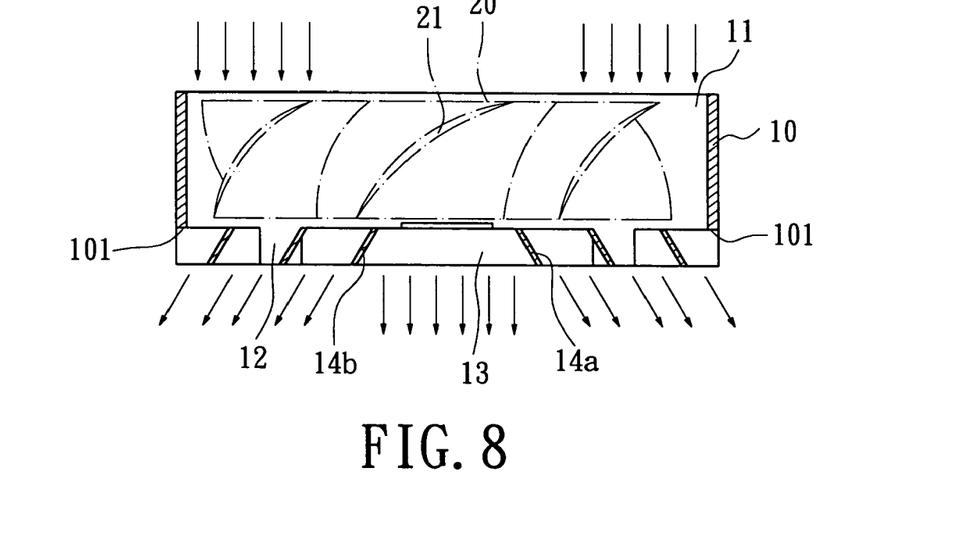
FIG. 8 is a cross-sectional view, taken along line 8—8 in FIG. 7, of the airflow guiding structure for the heat dissipation fan in accordance with the fourth embodiment of the present invention.

Turning now to FIGS. 7 and 8, they illustrate the airflow guiding structure for the heat dissipation fan in accordance with the fourth embodiment of the present invention. In comparison with the first embodiment, the first guiding members 14a of the fourth embodiment are spaced apart from the second guiding members 14b so that airflow may exhaust therebetween. When the airflow passes through the air passage, the guiding members 14a and 14b separate airflow into three predetermined directions.

Figure 9:
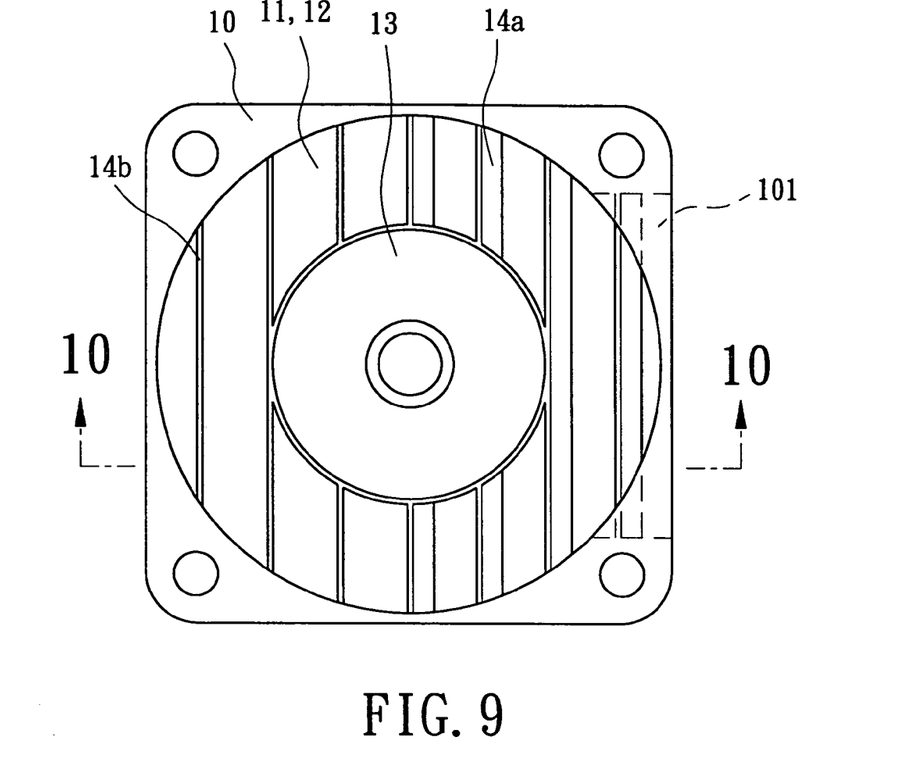
FIG. 9 is a top view of the airflow guiding structure for the heat dissipation fan in accordance with the fifth embodiment of the present invention.
Figure 10:
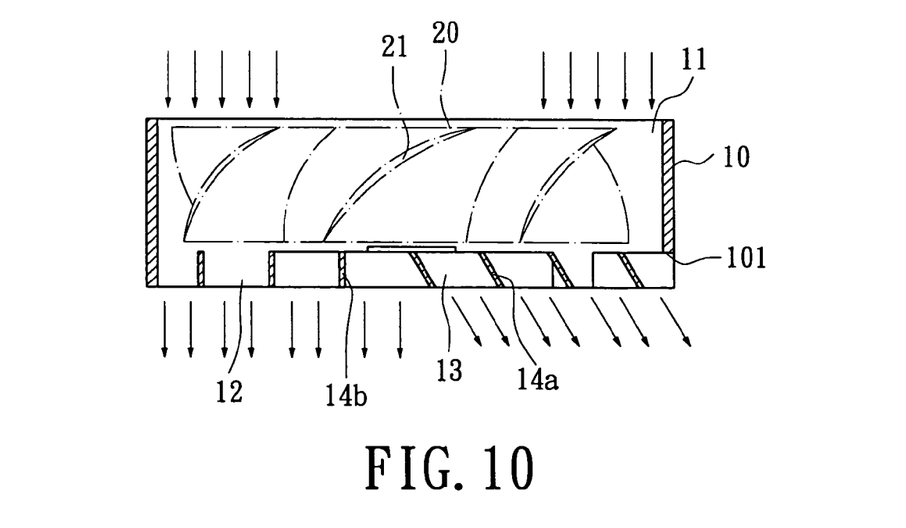
FIG. 10 is a cross-sectional view, taken along line 10—10 in FIG. 9, of the airflow guiding structure for the heat dissipation fan in accordance with the fifth embodiment of the present invention.

Turning now to FIGS. 9 and 10, they illustrate the airflow guiding structure for the heat dissipation fan in accordance with the fifth embodiment of the present invention. In comparison with the first embodiment, the first guiding members 14a of the fifth embodiment are arranged in a predetermined inclination while the second guiding members 14b arranged in a vertical direction. The housing 10 has an auxiliary air outlet 101 adjacent to the first guiding members 14a. When the airflow passes through the air outlet 12, the first guiding members 14a deflects airflow to a predetermined direction and the second guiding members 14b guides airflow to a vertical direction.

Figure 11:
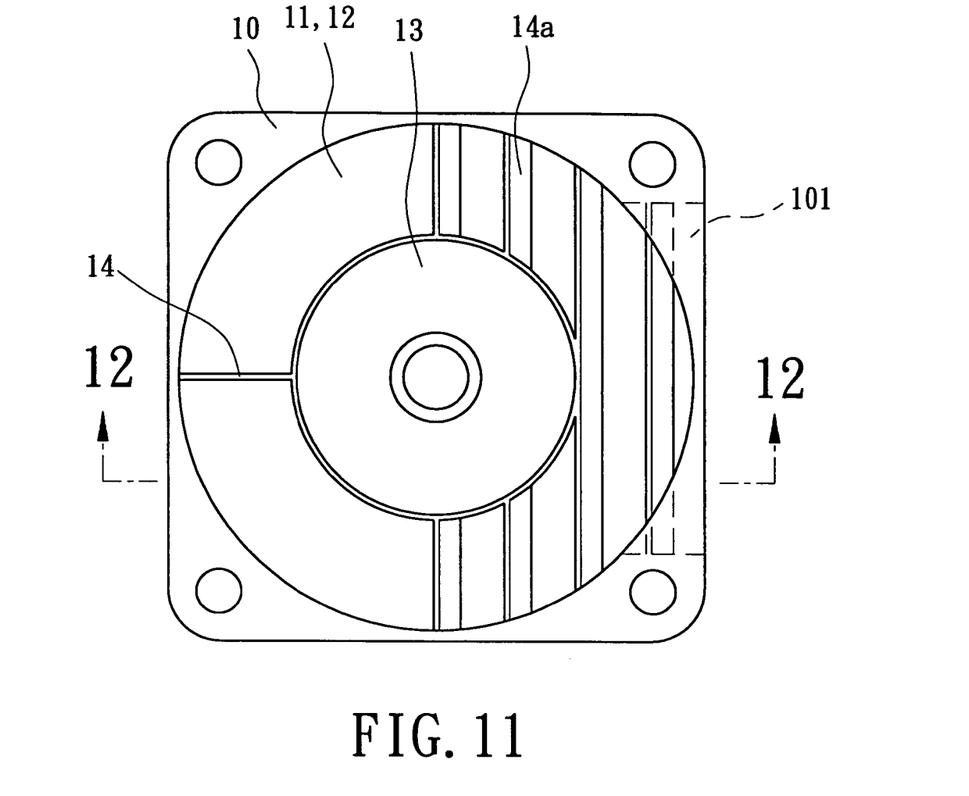
FIG. 11 is a top view of the airflow guiding structure for the heat dissipation fan in accordance with the sixth embodiment of the present invention.
Figure 12:
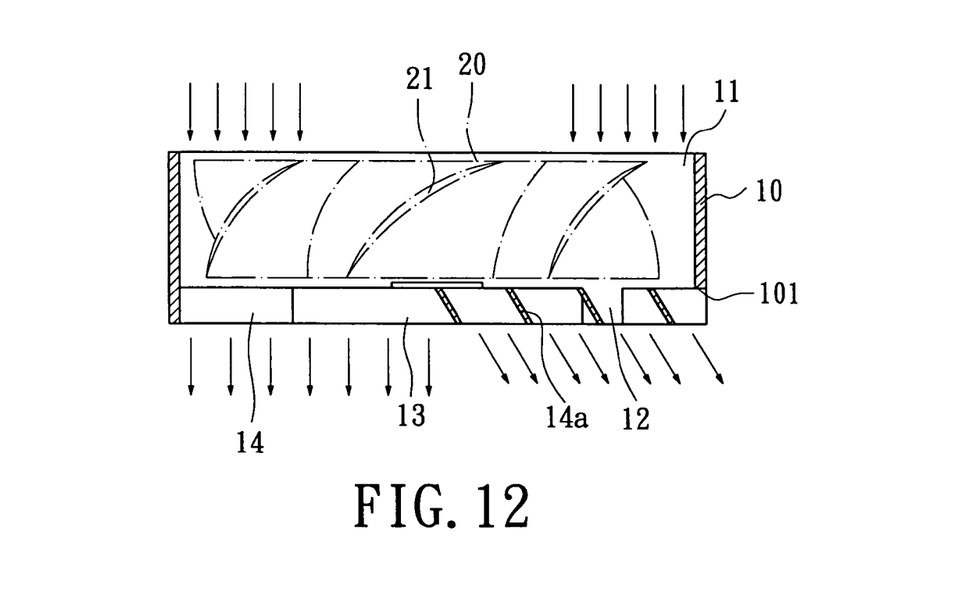
FIG. 12 is a cross-sectional view, taken along line 12—12 in FIG. 11, of the airflow guiding structure for the heat dissipation fan in accordance with the sixth embodiment of the present invention.

Turning now to FIGS. 11 and 12, they illustrate the airflow guiding structure for the heat dissipation fan in accordance with the sixth embodiment of the present invention. In comparison with the fifth embodiment, the first guiding members 14a of the sixth embodiment are arranged in a predetermined inclination; a single supporting rib 14 substitutes the second guiding members 14b, and has a vertical width and orientation along the axis of the air outlet 12. The housing 10 has an auxiliary air outlet 101 adjacent to the first guiding members 14a. When the airflow passes through the air outlet 12, the first guiding members 14a deflects airflow to a predetermined direction. By contrast, airflow still runs in a vertical direction while no guiding member guiding it.

Figure 13:
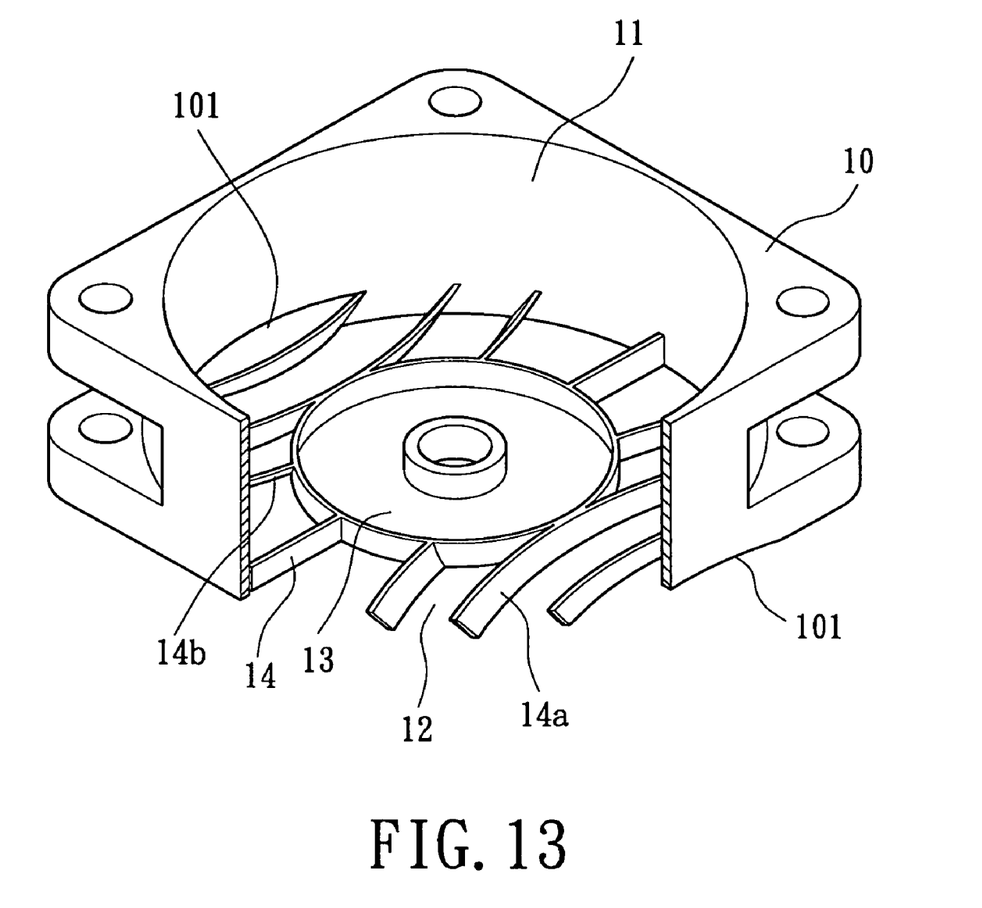
FIG. 13 is a partially cutaway perspective view of the airflow guiding structure for the heat dissipation fan in accordance with the seventh embodiment of the present invention.
Figure 14:
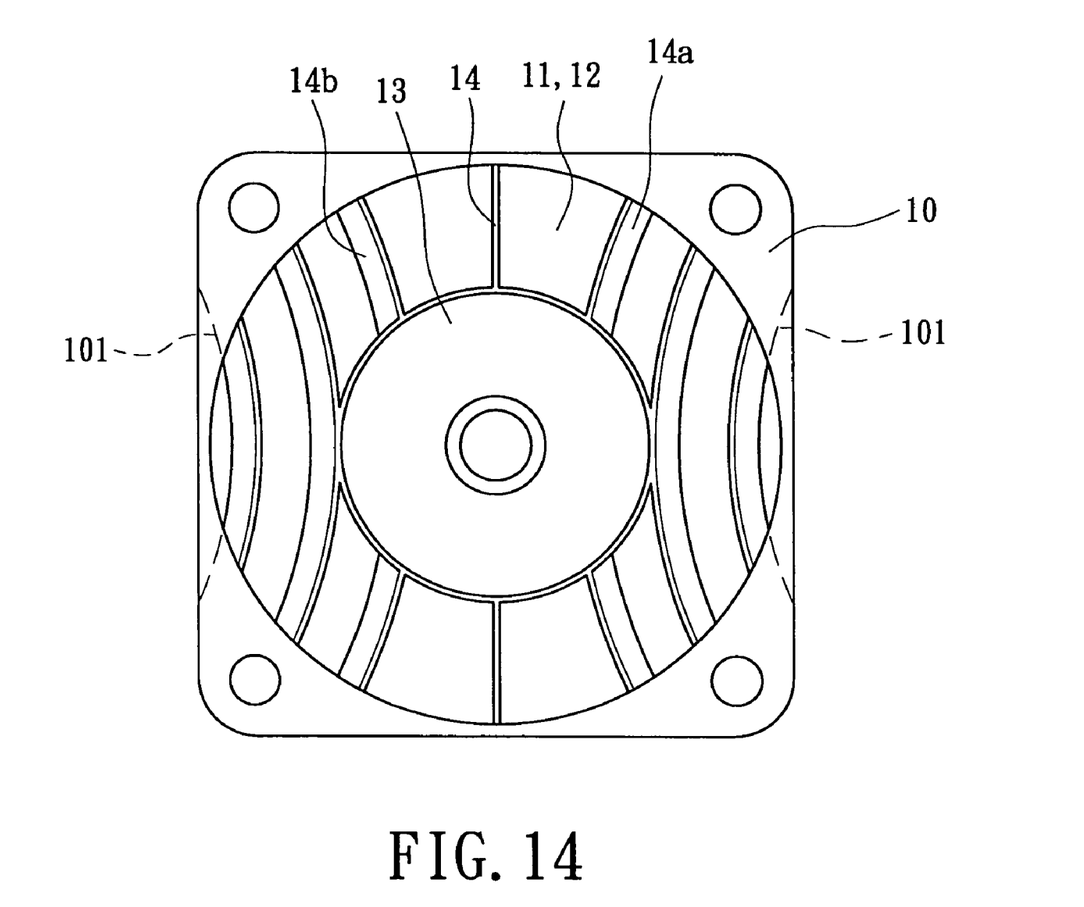
FIG. 14 is a top view of the airflow guiding structure for the heat dissipation fan in accordance with the seventh embodiment of the present invention.

Turning now to FIGS. 13 and 14, they illustrate the airflow guiding structure for the heat dissipation fan in accordance with the seventh embodiment of the present invention. In comparison with the first embodiment, each of the first guiding members 14a and the second guiding members 14b of the seventh embodiment has a transverse extension along a curved line. Each of the auxiliary air outlets 101 of the housing 10 has a curved edge corresponding to the guiding member. When the airflow passes through the air outlet 12, one supporting rib 14 is used to separate airflow of the first guiding members 14a from that of the second guiding members 14b so as to reduce air noise. Preferably, the supporting rib 14 has a vertical width and orientation along the axis of the air outlet 12. The first guiding members 14a and the second guiding members 14b constitute a grille that enhances product appearance and increases additional value.

Figure 15:
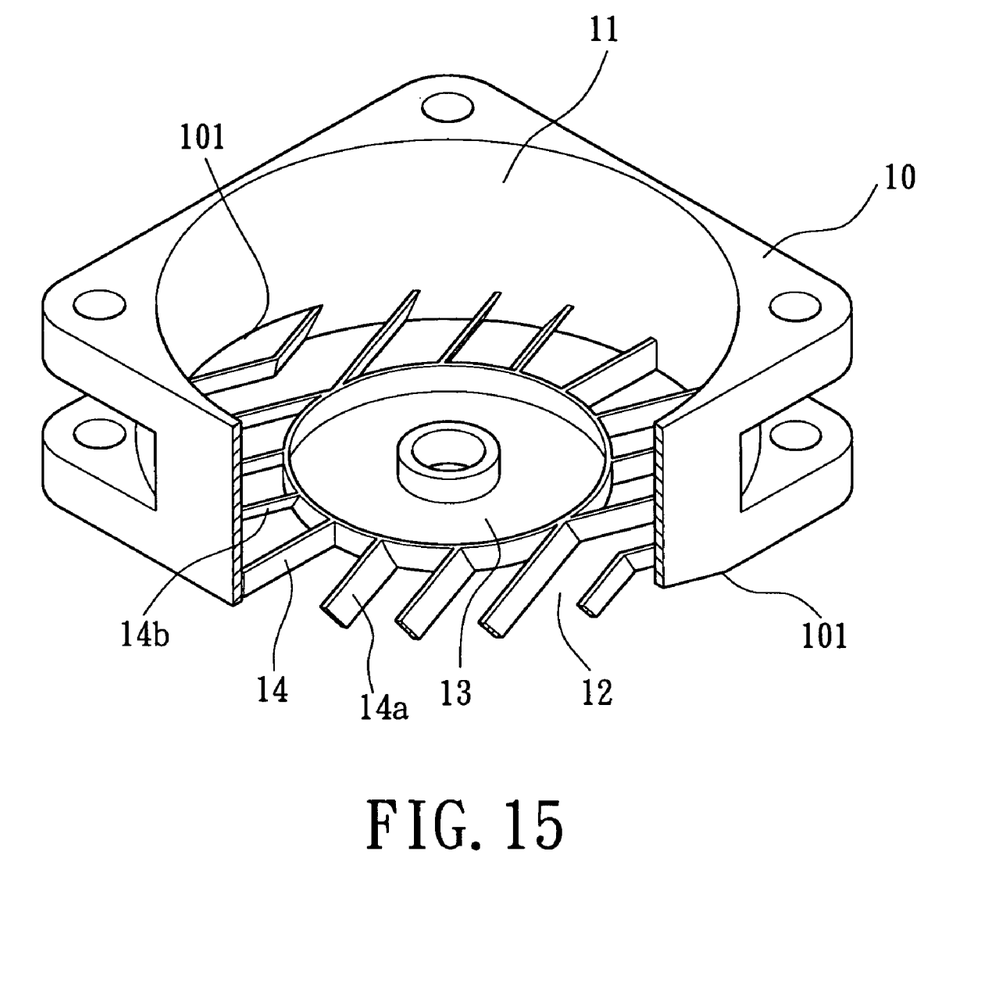
FIG. 15 is a partially cutaway perspective view of the airflow guiding structure for the heat dissipation fan in accordance with the eighth embodiment of the present invention.
Figure 16:
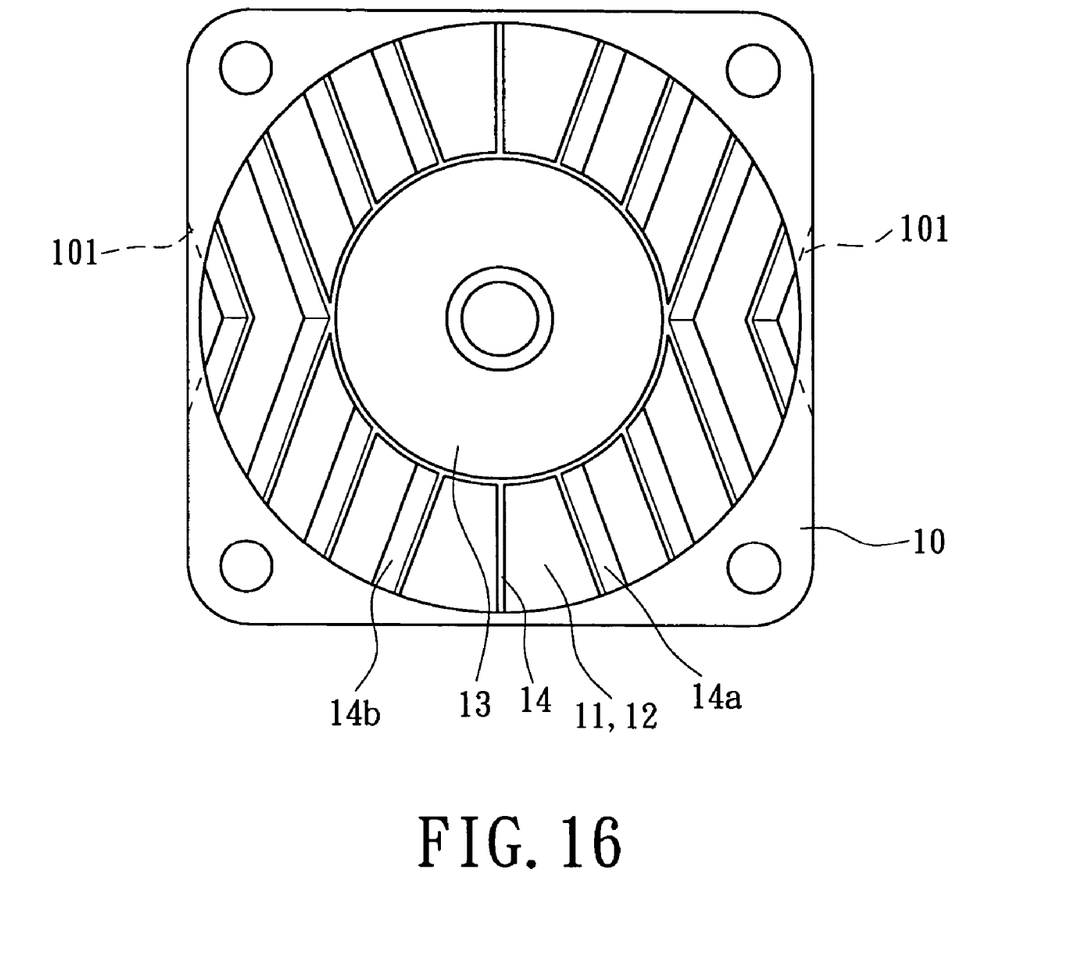
FIG. 16 is a top view of the airflow guiding structure for the heat dissipation fan in accordance with the eighth embodiment of the present invention.

Turning now to FIGS. 15 and 16, they illustrate the airflow guiding structure for the heat dissipation fan in accordance with the eighth embodiment of the present invention. In comparison with the first embodiment, each of the first guiding members 14a of the eighth embodiment has a transverse extension along a V-shaped line; each of the second guiding members 14b has a transverse extension along an inverted V-shaped line. Each of the auxiliary air outlets 101 of the housing 10 has a V-shaped edge corresponding to the guiding member. When the airflow passes through the air outlet 12, one supporting rib 14 is used to separate airflow of the first guiding members 14a from that of the second guiding members 14b so as to reduce air noise. Preferably, the supporting rib 14 has a vertical width and orientation along the axis of the air outlet 12. The first guiding members 14a and the second guiding members 14b constitute a grille that enhances product appearance and increases additional value.

Figure 17:
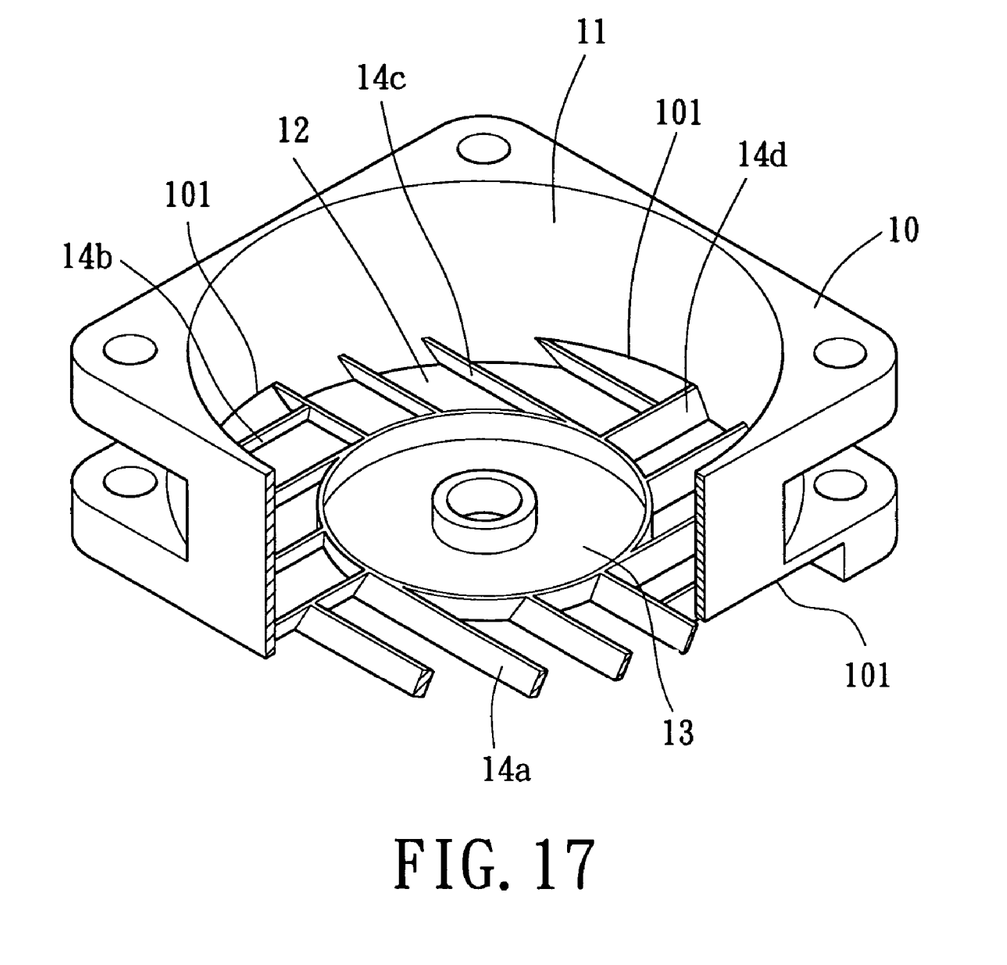
FIG. 17 is a partially cutaway perspective view of the airflow guiding structure for the heat dissipation fan in accordance with the ninth embodiment of the present invention.
Figure 18:
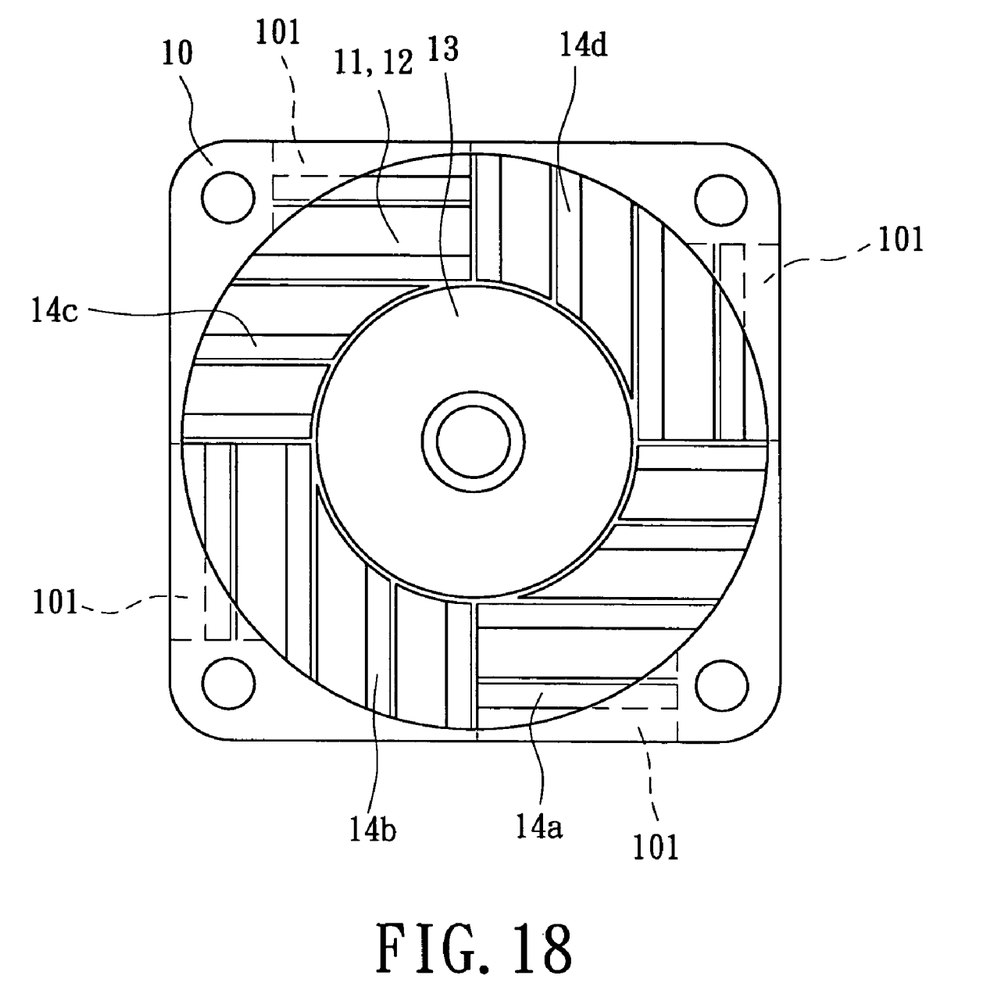
FIG. 18 is a top view of the airflow guiding structure for the heat dissipation fan in accordance with the ninth embodiment of the present invention.

Turning now to FIGS. 17 and 18, they illustrate the airflow guiding structure for the heat dissipation fan in accordance with the ninth embodiment of the present invention. In comparison with the first embodiment, the first guiding members 14a, the second guiding members 14b, the third guiding members 14c and the fourth guiding member 14d of the ninth embodiment constitute a grille. Each of the auxiliary air outlets 101 of the housing 10 is adjacent to the corresponding guiding member 14a through 14d. When the airflow passes through the air outlet 12, the guiding members 14a through 14d deflect airflow to four predetermined directions.

Referring back to FIGS. 2 through 18, as is known in previous embodiments, the first guiding members 14a and the second guiding members 14b are used to deflect airflow. In design choice, numbers, orientations of inclination and inclined angle of the first guiding members 14a and the second guiding members 14b may be designed according to dimensions of the fan wheel 20, inclination of blades 21 and sizes of heat generating components.

Referring back to FIG. 1, the conventional housing structure may cause air turbulence at its air outlet and is unable to guide airflow to multiple predetermined directions. Referring back to FIG. 2, by contrast, the air outlet 12 of the housing 10 provides with a plurality of guiding members and a plurality of auxiliary air outlets for guiding airflow to multiple predetermined directions. The guiding members consist of first guiding members 14a and second guiding members 14b to deflect airflow at the air outlet 12 of the housing 10, thereby increasing the entire heat-dissipation efficiency, air pressure, reducing air noise and increasing design choice.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. An airflow guiding structure for a heat dissipation fan, comprising:

a housing provided with an air inlet and an air outlet, and an annular wall between the air inlet and the air outlet;

a base mounted in the air outlet for supporting a fan wheel which formed with a plurality of blades;

at least one auxiliary air outlet formed in the annular wall of the housing proximate the air outlet; and a plurality of guiding members arranged in the air outlet and inclined with respect to an axis of the housing, the auxiliary air outlet being adjacent to at least one of the guiding members, said at least one of said guiding members guiding air to said auxiliary air outlet;

wherein when the fan wheel rotates, the guiding members deflect airflow in at least two airflow directions, including at least a first airflow direction at the air outlet and at least a second airflow direction at the auxiliary air outlet.

2. The airflow guiding structure for the heat dissipation fan as defined in claim 1, wherein the auxiliary air outlet connects to the air outlet for exhausting airflow.

3. The airflow guiding structure for the heat dissipation fan as defined in claim 1, wherein the guiding members commonly constitute a grille structure and each of the guiding members has a lateral transverse extension selected from a group consisting of a straight line, a V-shaped line, and a curved line.

4. The airflow guiding structure for the heat dissipation fan as defined in claim 1, wherein each of the guiding members has a first camber edge proximate an air inlet, and a second camber edge proximate an air outlet.

5. The airflow guiding structure for the heat dissipation fan as defined in claim 1, wherein each of the guiding members is formed with a triangular cross-section.

6. The airflow guiding structure for the heat dissipation fan as defined in claim 1, further comprising a supporting rib having a vertical width and orientation along an axis of the air outlet.

7. The airflow guiding structure for the heat dissipation fan as defined in claim 1, wherein the two adjacent guiding members are connected to each other to constitute an inverted V section.

8. The airflow guiding structure for the heat dissipation fan as defined in claim 7, wherein the base is supported by the guiding members in the air outlet.

9. The airflow guiding structure for the heat dissipation fan as defined in claim 1, wherein the guiding members have regular or irregular inclination.

10. The airflow guiding structure for the heat dissipation fan as defined in claim 1, wherein at least one of said guiding members has an inclination with respect to said auxiliary air outlet.

11. The airflow guiding structure for the heat dissipation fan as defined in claim 1, wherein at least one of said guiding members is disposed in said auxiliary air outlet.

* * * * *